United States Patent
Ostermayr et al.

(10) Patent No.: US 7,394,682 B2
(45) Date of Patent: Jul. 1, 2008

(54) BIT LINE DUMMY CORE-CELL AND METHOD FOR PRODUCING A BIT LINE DUMMY CORE-CELL

(75) Inventors: Martin Ostermayr, Feldkirchen (DE); Christophe Chanussot, Antibes (FR); Vincent Gouin, Mandelieu (FR); Alexander Olbrich, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/586,176

(22) Filed: Oct. 25, 2006

(65) Prior Publication Data

US 2008/0112245 A1 May 15, 2008

(51) Int. Cl.
*G11C 11/00* (2006.01)
(52) U.S. Cl. ........................ 365/154; 365/207
(58) Field of Classification Search ................ 365/154, 365/156, 200, 207, 230.06, 230.08
See application file for complete search history.

(56) References Cited

U.S. PATENT DOCUMENTS

| | | | | |
|---|---|---|---|---|
| 5,850,364 A | * | 12/1998 | Ueno | 365/203 |
| 6,172,925 B1 | * | 1/2001 | Bloker | 365/210 |
| 6,335,891 B1 | * | 1/2002 | Wilkins | 365/225.7 |

* cited by examiner

*Primary Examiner*—Gene N. Auduong
(74) *Attorney, Agent, or Firm*—Jenkins, Wilson, Taylor & Hunt, P.A.

(57) ABSTRACT

A bit line dummy core-cell comprises at least a first inverter and at least a second inverter which are cross coupled to form a bistable flip-flop. The first inverter comprises a first PMOS transistor and a first NMOS transistor connected in series by means of a first internal storage node between a high reference potential and a low reference potential. The second inverter comprises a second PMOS transistor and a second NMOS transistor connected in series by means of a second internal storage node. The source of the second PMOS transistor and the second internal storage node are connected to the low reference potential so that the first internal storage node always stores a logic high level. A first access transistor is coupled between a dummy bit line providing a self-timing signal and the first internal node storing the logical high level.

9 Claims, 3 Drawing Sheets

BIT LINE DUMMY CORE-CELL AND METHOD FOR PRODUCING A BIT LINE DUMMY CORE-CELL

BACKGROUND OF THE INVENTION

The present invention relates to a bit line dummy core-cell and a method for producing a bit line dummy core-cell.

Basic operations of semiconductor memory devices such as static random access memories (SRAMs) are reading and writing of data. In a conventional two-dimensional memory architecture, a word line connects to the gates of memory cell transistors in a row of memory cells, and a bit line connects to the sources or drains of the memory cell transistors in a column of memory cells. The operation of reading data in a typical semiconductor memory device is controlled by a signal, referred to as a read enable signal.

Said read enable signal is generated and provided by a logic SRAM memory compiler. In advanced technologies the realization of logic SRAM memory compilers is strongly dependent on some key design techniques. One of these key implementations is the realization of the so called bit line dummy concept.

The bit line dummy concept involves a dummy bit line, used as a part of the self-timing block in a memory macro providing a self-timing signal. The logic SRAM compiler generates said read enable signal dependent on said self-timing signal. The purpose of the dummy bit line is to represent and emulate the worst case capacitance, resistance and re-catch of an active array bit line during read and write operation.

The dummy bit line core-cell should track and reflect the same properties and dependencies on process and technology as the array bit line. Therefore, it is mandatory, that the core-cell of the dummy bit line is in terms of design and layout as close as possible to the SRAM array core-cell.

FIG. 1 shows a schematic view of a conventional bit line dummy core-cell array comprising m bit line dummy core-cells, wherein m designates the number of rows of the memory cells.

In the following, without loss of any generality, only the first bit line dummy core-cell 1 is explained in detail. The bit line dummy core-cell 1 comprises a first inverter 2 and a second inverter 3. The first inverter 2 and the second inverter 3 are cross-coupled to form a bistable flip-flop. The first inverter 2 comprises a first PMOS transistor 4 and a first NMOS transistor 5 connected in series by means of a first internal storage node 6 between a high reference potential VDD and a low reference potential VSS in particular. The high reference potential VDD is a power supply potential and the low reference potential is a ground potential. The second inverter 3 comprises a second PMOS transistor 7 and a second NMOS transistor 8 connected in series by means of a second internal storage node 9 between the high reference potential VDD and the low reference potential VSS.

Further, a first access transistor 11 is coupled between a dummy bit line 10 and the first internal storage node 6. Furthermore, a second access transistor 12 is coupled between the second internal storage node 9 and a bit line complement 13.

The first internal storage node 6 connects the drain of the first PMOS transistor 4 and the source of the first NMOS transistor 5. The second internal storage node 9 connects the drain of the second PMOS transistor 7 and the source of the second NMOS transistor 8. The gate of the first access transistor 11 is connected to a first word line 14 and the gate of the second access transistor 12 is connected to a second word line 15. In particular, both word lines 14, 15 are biased with the low reference potential VSS. Further, also the dummy bit line complement 13 coupled to the second access transistor 12 is connected to the low reference potential VSS.

During the read operation of the memory macro comprising the plurality of memory cells, the discharge of the dummy bit line 10 triggers the read sensing circuitry as part of the logic SRAM compiler. This means, that the dummy bit line 10 needs to represent the worst case capacitance, resistance and leakage current of any memory core-cell configuration, which could occur along a bit line.

The leakage current criterion is of special importance for the tuning of the self-timing path of the dummy bit line connected to said m bit line dummy core-cells for high performance memories. During the read operation, the development of the differential signal on the bit line and bit line complement results from the read current of the accessed cell in relation to the sum of the leakage currents of the non-selected cells on the same bit line. The leakage of the non-selected cells reduces the differential signal available for sensing the content of the cell during the read operation. A longer time is needed to read sufficient signal amplitude. Because the time for signal development is defined by the self-timing circuitry based on the dummy bit line, which is implemented, a too fast discharge of the dummy bit line due to the leakage and thus, an insufficient signal amplitude of the read signal must be avoided.

To minimize the amount of leakage current flowing through the dummy bit line, all the corresponding bit line dummy core-cells must store a logic high level or a logic one value. Under these conditions, the subthreshold leakage current through the access transistor of the cells is reduced dramatically. For the timing of the memory this corresponds to the worst case situation and as a result, the optimal self timing signal can be provided.

BRIEF SUMMARY OF THE INVENTION

According to a first aspect of the invention, a bit line dummy core-cell is provided comprising:

at least a first inverter and at least a second inverter which are cross-coupled to form a bistable flip-flop, wherein the first inverter comprises a first PMOS transistor and a first NMOS transistor connected in series by means of a first internal storage node between a high reference potential and a low reference potential and the second inverter comprises a second PMOS transistor and a second NMOS transistor connected in series by means of a second internal storage node, wherein the source of the second PMOS transistor and the second internal storage node are connected to the low reference potential, so that the first internal storage node always stores a logic high level;

a dummy bit line which provides a self-timing signal; and a first access transistor coupled between the dummy bit line and the first internal node storing the logic high level.

According to a second aspect of the invention, a method for producing a bit line dummy core-cell is provided, comprising the steps of:

providing an SRAM cell comprising at least a first inverter comprising a first PMOS transistor and a first NMOS transistor and a second inverter comprising a second PMOS transistor and a second NMOS transistor, wherein the first inverter and the second inverter are cross-coupled to form a bistable flip-flop;

coupling the drain of the first PMOS transistor and the source of the first NMOS transistor by means of a first internal storage node;

coupling the drain of the second PMOS transistor and the source of the second NMOS transistor by means of a second internal storage node, so that the first internal storage node always stores a logic high level;

coupling the first internal storage node by means of a first access transistor with a dummy bit line providing a self-timing signal;

connecting the second storage node and the source of the second PMOS transistor with ground to provide the bit line dummy core-cell.

As an advantage of the present invention, it is ensured that the first internal storage node coupled with the dummy bit line providing the self-timing signal stores a logic high level respectively a logic 1. Therefore, the bit line dummy core-cell of the present invention reflects the worst case capacitance and resistance as well the leakage configuration. As a result, the self-timing signal is optimal for generating the read enable signal ensuring the optimal time window for reading a memory cell.

As a further advantage of the present invention, the risk of an ESD failure is eliminated because the second PMOS transistor, its gate receiving a logic low level respectively a logic zero value is blocked. This is achieved by connecting the source of said PMOS transistor with ground and, therefore, there is no potential difference between the source and the drain of said PMOS transistor.

As a further advantage, the present invention is very simple to realize effecting low costs for producing a bit line dummy core-cell of the present invention.

Because the worst case is reflected by the self-timing signal of the present invention, the memory cell can be discharged very fast.

As an embodiment of the bit line dummy core-cell of the present invention, a second access transistor is arranged between a dummy bit line complement and a second internal storage node.

Preferably, the first internal storage node connects the drain of the first PMOS transistor and the source of the first NMOS transistor.

As a variant of the bit line dummy core-cell of the present invention, the second internal storage node connects said drain of the second PMOS transistor and the source of the second NMOS transistor.

Preferably, the high reference potential is a power supply potential and/or the reference potential is a ground potential.

As a variant of the bit line core-cell of the present invention, the gate of the first access transistor and/or the gate of the second access transistor are each connected to a word line which is connected to the low reference potential.

Preferably, the dummy bit line complement is connected to the low reference potential.

According to a further aspect of the present invention, an SRAM memory array is provided, comprising:

a plurality of SRAM storage cells arranged in m rows and n columns;

m bit line dummy core-cells as explained above arranged in the vicinity of the m rows of the SRAM storage cells and connected at least to the dummy bit line providing the self-timing signal; and a timer tracking circuit receiving the self-timing signal and controlling the reading and writing operations of the SRAM storage cells.

DETAILED DESCRIPTION OF THE INVENTION

In the figures, unless specified otherwise, identical or functionally identical elements have been provided with the same reference symbols.

Figure 1:
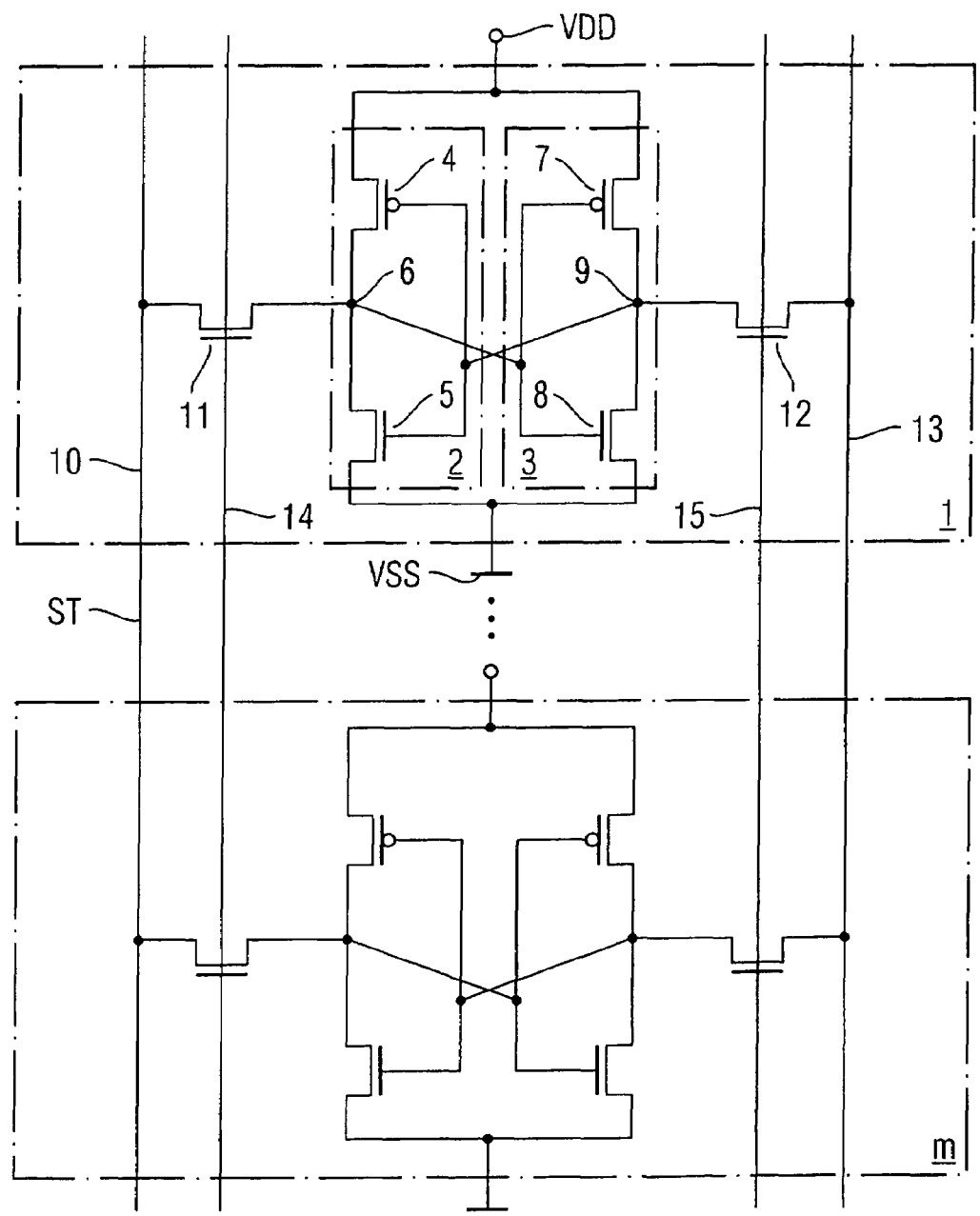
FIG. 1 is a schematic view of a conventional bit line dummy core-cell array.
Figure 2:
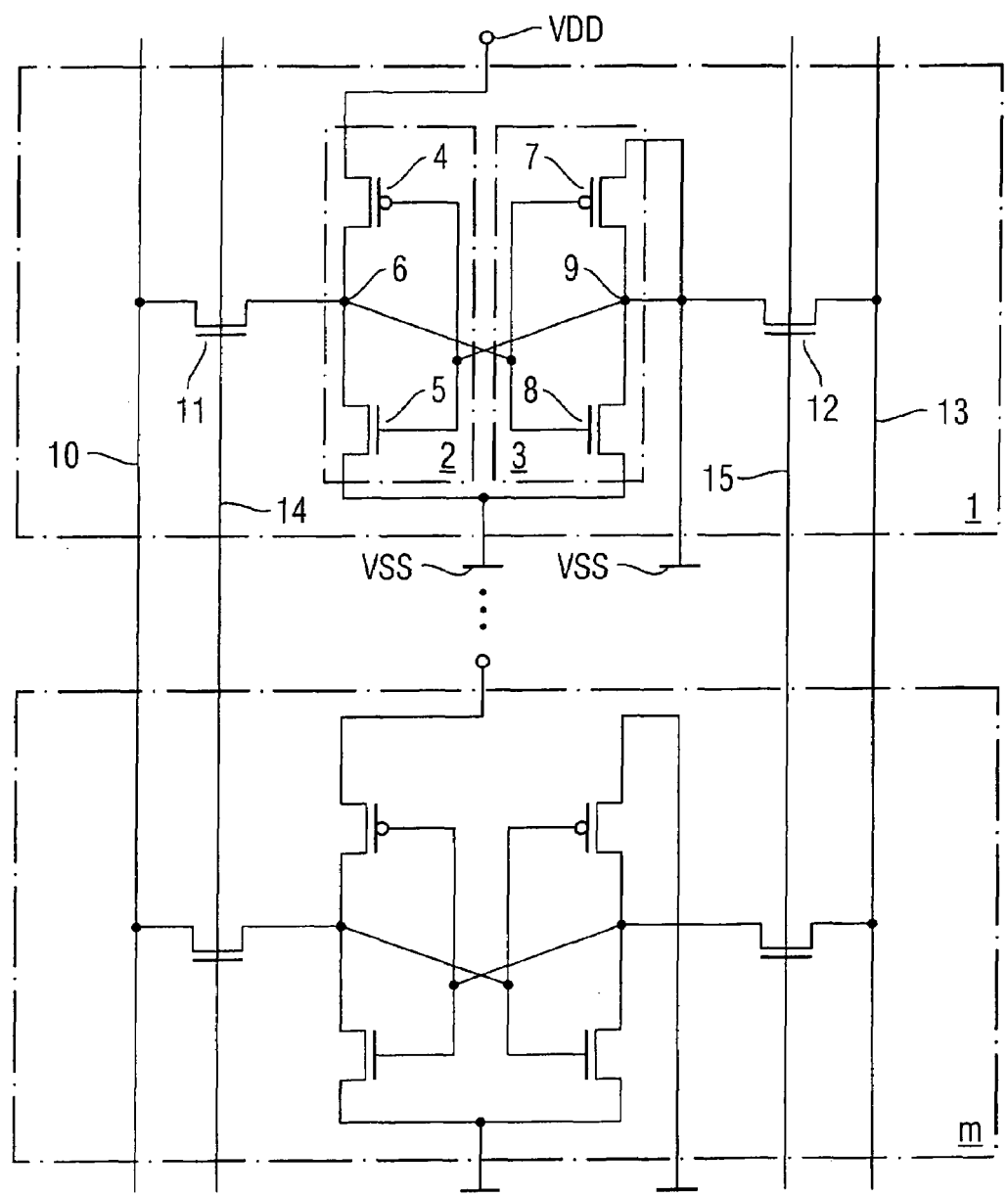
FIG. 2 is a schematic view of a bit line dummy core-cell array comprising a plurality of bit line dummy core-cells.

FIG. 2 shows a schematic view of the bit line dummy core-cell array comprising a plurality of bit line dummy core-cells l, m.

Without loss of any generality, in the following only the first bit line dummy core-cell 1 is explained.

According to the present invention, the bit line dummy core-cell 1 comprises at least a first inverter 2 and at least a second inverter 3. The first inverter 2 comprises a first PMOS transistor 4 and a first NMOS transistor 5 connected in series by means of a first internal storage node 6 between a high reference potential VDD and a low reference potential VSS.

The second inverter 3 comprises a second PMOS transistor 7 and a second NMOS transistor 8 connected in series by means of a second internal storage node 9.

The source of the second PMOS transistor 8 and the second internal storage node 9 are connected to the low reference potential VSS. As a result, the second internal storage node 9 is grounded. Therefore, the bit line dummy cells 1 are forced to flip to the required logic one without causing an ESD violation or risk of discharging, namely the first internal storage node 6 stores a logic one. Further, there is no potential difference between the source and the drain of the second PMOS transistor 7, advantageously.

Furthermore, a first access transistor 11 is provided which is coupled between a dummy bit line 10 providing a self-timing signal ST and the first internal node 6 storing a logic one respectively a logic high level.

Preferably, the second access transistor 13 is coupled between a dummy bit line complement 13 and a second internal storage node 9.

In particular, the first internal storage node 9 connects the drain of the first PMOS transistor 4 and the source of the first NMOS transistor 5. Preferably, the second internal storage node 9 connects the drain of the second PMOS transistor 7 and the source of the second NMOS transistor 8. A high reference potential VDD may be a power supply potential and/or the low reference potential VSS may be a ground potential.

Preferably, the gate of the first access transistor 11 is connected to a first word line 14 which is connected to the low reference potential VSS. Further, the gate of the second access transistor 12 may be connected to a second word line 15 which is also connected to the low reference potential VSS.

In particular, the dummy bit line complement 13 is also connected to the low reference potential VSS.

Preferably, the source of the first access transistor 11 is connected to the first internal storage node 6. The drain of the first access transistor 11 is for example connected to the dummy bit line 10. The source of the second access transistor 12 may be connected with the dummy bit line complement 13 and the drain of the second access transistor 12 may be connected to the second storage node 9.

Figure 3:
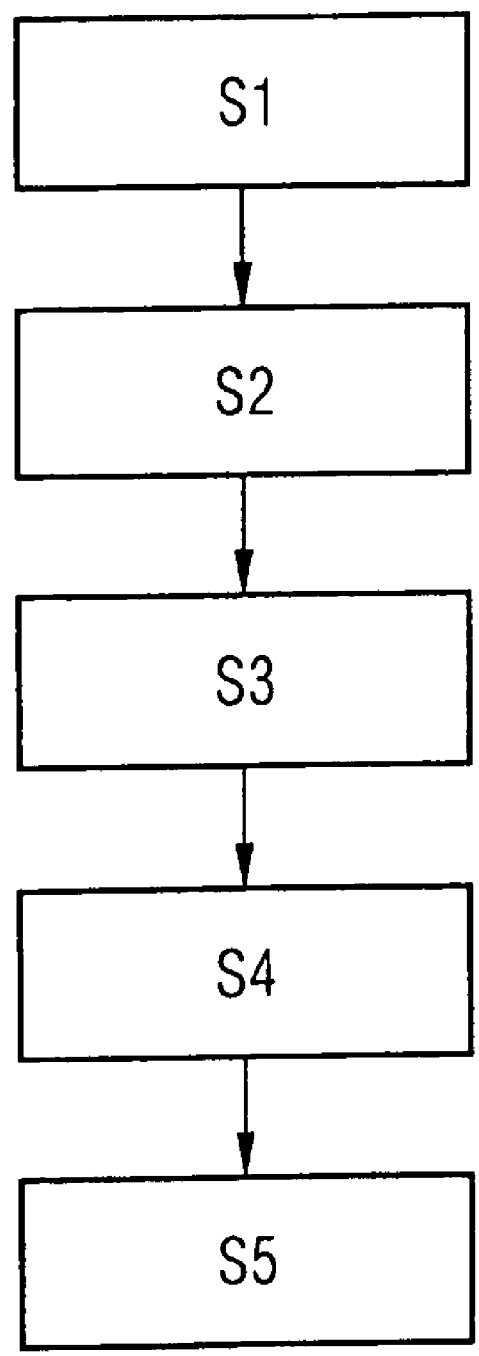
FIG. 3 is a schematic flow diagram of a method for producing a bit line dummy core-cell.

FIG. 3 shows a schematic flow diagram of a method for producing a bit line dummy core-cell 1, comprising the steps S1 to S5:

Method Step S1:

An SRAM cell comprising at least a first inverter 2 and a second inverter 3 is provided. The first inverter 2 comprises a first PMOS transistor 4 and a first NMOS transistor 5. The second inverter 3 comprises a second PMOS transistor 7 and a second NMOS transistor 8. The first inverter 2 and the second inverter 3 are cross-coupled to form bistable flip-flop.

Method Step S2:

The drain of the first PMOS transistor 4 and the source of the first NMOS transistor 5 are coupled by means of a first internal storage node 6.

Method Step S3:

The drain of the second PMOS transistor 7 and the source of the second NMOS transistor 8 are coupled by means of a second internal storage node 9, so that the first internal storage node 6 always stores a logic high level respectively a logic one.

Method Step S4:

The first internal storage node 6 is coupled with a dummy bit line 10 by means of a first access transistor 11, wherein the dummy bit line 10 provides a self-timing signal ST.

Method Step S5:

The second storage node 9 and the source of the second PMOS transistor 7 are connected with grounds to provide the bit line dummy core-cell 1.

Although, the present invention has been explained on the basis of particular exemplary embodiments, it is not restricted thereto, but rather can be modified in any desired manner without deporting from the basic principle of the invention.

In particular, the bit line dummy core-cell of the explained embodiments is based on a single-port synchronous random access memory, but could also be based on a dual-port synchronous random access memory.

What is claimed is:

1. A bit line dummy core-cell, comprising:
   (a) at least a first inverter and at least a second inverter which are cross-coupled to form a bistable flip-flop, wherein the first inverter comprises a first PMOS transistor and a first NMOS transistor connected in series by means of a first internal storage node between a high reference potential and a low reference potential and the second inverter comprises a second PMOS transistor and a second NMOS transistor connected in series by means of a second internal storage node, wherein the source of the second PMOS transistor and the second internal storage node are connected to the low reference potential, so that the first internal storage node always stores a logic high level;
   (b) a dummy bit line configured to provide a self-timing signal; and
   (c) a first access transistor coupled between the dummy bit line and the first internal node that stores the logic high level.

2. The bit line dummy core-cell of claim 1, comprising a second access transistor coupled between a dummy bit line complement and the second internal storage node.

3. The bit line dummy core-cell of claim 1, wherein the first internal storage node connects the drain of the first PMOS transistor and the source of the first NMOS transistor.

4. The bit line dummy core-cell of claim 1, wherein the second internal storage node connects the drain of the second PMOS transistor and the source of the second NMOS transistor.

5. The bit line dummy core-cell of claim 1, wherein the high reference potential is a power supply potential and/or the low reference potential is a ground potential.

6. The bit line core-cell of claim 2, wherein the gate of the first access transistor and/or the gate of the second access transistor are each connected to a word line connected to the low reference potential.

7. The bit line core-cell of claim 2, wherein the dummy bit line complement is connected to the low reference potential.

8. An SRAM memory array, comprising:
   (a) a plurality of SRAM storage cells arranged in m rows and n columns;
   (b) m bit line dummy core-cells arranged in the vicinity of the m rows of the SRAM storage cells and connected at least to the dummy bit line providing the self-timing signal, a bit line dummy core-cell having at least a first inverter and at least a second inverter which are cross-coupled to form a bistable flip-flop, wherein the first inverter comprises a first PMOS transistor and a first NMOS transistor connected in series by means of a first internal storage node between a high reference potential and a low reference potential and the second inverter comprises a second PMOS transistor and a second NMOS transistor connected in series by means of a second internal storage node, wherein the source of the second PMOS transistor and the second internal storage node are connected to the low reference potential, such that the first internal storage node always stores a logic high level, a dummy bit line configured to provide a self-timing signal, and a first access transistor coupled between the dummy bit line and the first internal node that stores the logic high level; and
   (c) a timer tracking circuit connected to the dummy bit line, configured to receive the self-timing signal and configured to control the reading and writing operations of the SRAM storage cells.

9. A method for producing a bit line dummy core-cell, comprising the steps of:
   (a) providing an SRAM cell comprising at least a first inverter comprising a first PMOS transistor and a first NMOS transistor and a second inverter comprising a second PMOS transistor and a second NMOS transistor, wherein the first inverter and the second inverter are cross-coupled to form a bistable flip-flop;
   (b) coupling the drain of the first PMOS transistor and the source of the first NMOS transistor by means of a first internal storage node;
   (c) coupling the drain of the second PMOS transistor and the source of the second NMOS transistor by means of a second internal storage node, so that the first internal storage node always stores a logic high level;
   (d) coupling the first internal storage node by means of a first access transistor with a dummy bit line providing a self-timing signal; and
   (e) connecting the second storage node and the source of the second PMOS transistor with ground to provide the bit line dummy core-cell.

* * * * *